United States Patent
Ishii et al.

[11] Patent Number: 6,069,019
[45] Date of Patent: May 30, 2000

[54] METHOD OF MANUFACTURING TRANSISTOR ARRAY

[75] Inventors: Hiromitsu Ishii, Hamura; Hisao Tosaka, Hachioji, both of Japan

[73] Assignee: Casio Computer Co., Ltd., Tokyo, Japan

[21] Appl. No.: 08/980,083

[22] Filed: Nov. 26, 1997

[30] Foreign Application Priority Data

Dec. 10, 1996 [JP] Japan ................................ 8-344513

[51] Int. Cl.[7] ............................. H01L 21/00; H01L 21/84
[52] U.S. Cl. ........................................ 438/30; 438/158
[58] Field of Search .............................. 438/30, 149, 158

[56] References Cited

U.S. PATENT DOCUMENTS

5,334,859  8/1994  Matsuda .................................. 257/57

Primary Examiner—Brian Dutton
Attorney, Agent, or Firm—Frishauf, Holtz, Goodman, Langer & Chick, P.C.

[57] ABSTRACT

According to the present invention, a gate insulation film, a silicon film and silicon nitride film are laminated on a gate backing pad made of a gate metal film, and etching is carried out on the silicon nitride film such that it remains on the gate backing pad as a protective insulation film. Thus, the corrosion of the gate backing pad, which is caused as the etching solution penetrate the silicon film in defect, can be prevented. Further, a protective semiconductor layer formed by patterning the protective insulation film and the silicon film, is formed above the gate backing pad. Thus, the gate backing pad can be protected from the etching solution during the patterning of the pixel electrode made of ITO. Therefore, the disconnection of the gate backing pad can be prevented.

27 Claims, 12 Drawing Sheets

METHOD OF MANUFACTURING TRANSISTOR ARRAY

BACKGROUND OF THE INVENTION

The present invention relates to a method of manufacturing a transistor array.

Figure 17:
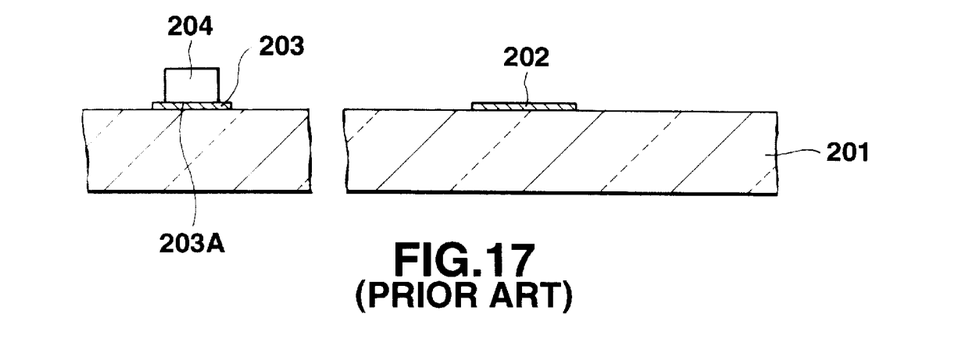
FIG. 17 is a cross sectional view illustrating a step of forming a gate metal film for a gate electrode and a gate backing pad.
Figure 18:
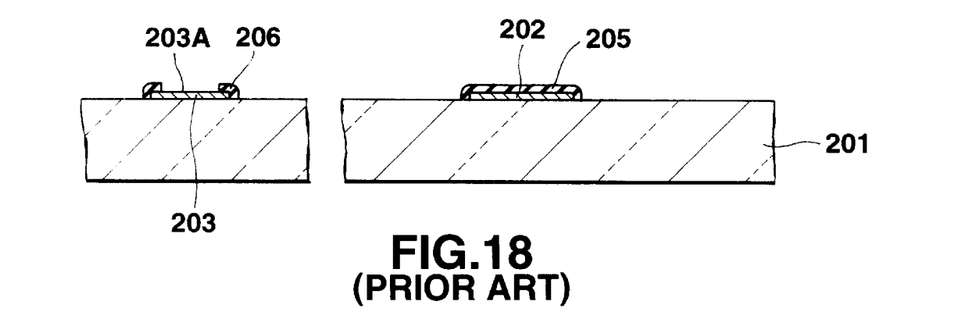
FIG. 18 is a cross sectional view illustrating a step of forming an anodic oxidized film from the gate metal film.
Figure 19:
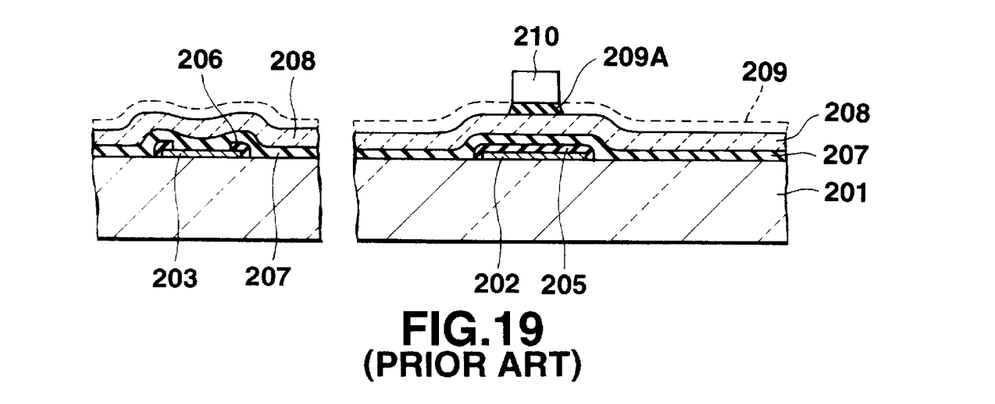
FIG. 19 is a cross sectional view illustrating a step of forming a blocking layer.

Generally, a thin film transistor (to be abbreviated as TFT hereinafter) is known as a transistor. TFTs are widely used as switching elements of active drive liquid crystal display devices. One of the conventionally known methods of manufacturing TFT arrays is illustrated in FIGS. 17 to 25. This method is designed for manufacturing a TFT of a reverse stagger type. First, FIG. 17 shows a state in which a gate electrode 202 made of aluminum, and a gate pad portion 203 serving as a terminal portion of a gate line connected to the gate electrode 202 are formed on the surface of a glass substrate 201 by patterning. After this, a resist 204 is formed only in a contact region 203A of the upper surface of the gate pad 203 by patterning. The resist 204 is patterned such that it is placed on the contact region 203A of the upper surface, so that a peripheral portion of the upper surface of the gate pad portion 203 is exposed. Then, an oxidizing treatment is carried out to from an anodic oxidized film 205 on the exposed surface of the Al film of the gate electrode 202, and an anodic oxidized film 206 on a circumferential side of the gate pad portion 203 and on the periphery of the upper surface thereof, respectively, as shown in FIG. 18. After that, as can be seen in FIG. 19, a gate insulation film 207 made of, for example, silicon nitride, a silicon film 208 made of amorphous silicon and a silicon nitride film 209 are respectively formed in the order. Subsequently, a resist mask 210 is formed on the silicon nitride film 209 located above the gate electrode 202. Then, the silicon nitride film 209 is selectively etched by wet-etching using buffered hydrofluoric acid to form a blocking layer 209A in the section corresponding to that of the silicon film 208 located above the gate electrode 202. After that, the resist 210 is removed.

Figure 20:
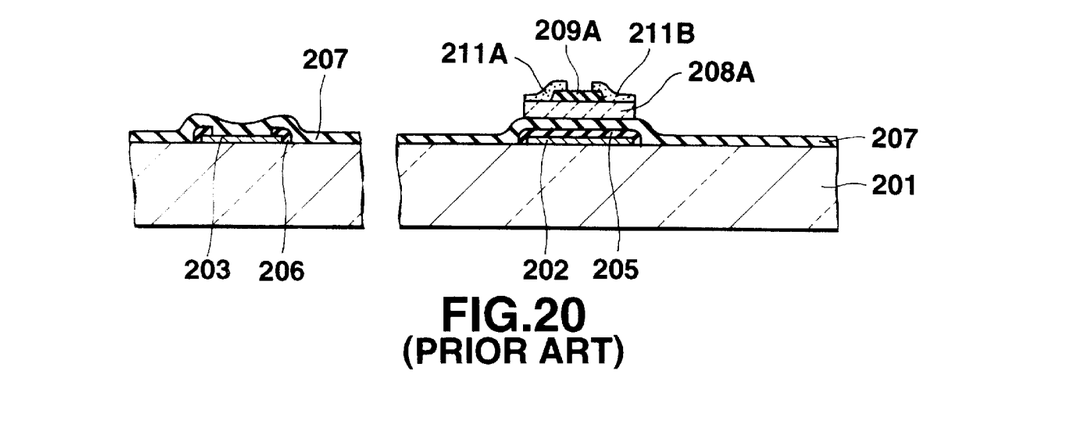
FIG. 20 is a cross sectional view illustrating a step of forming a semiconductor island.
Figure 21:
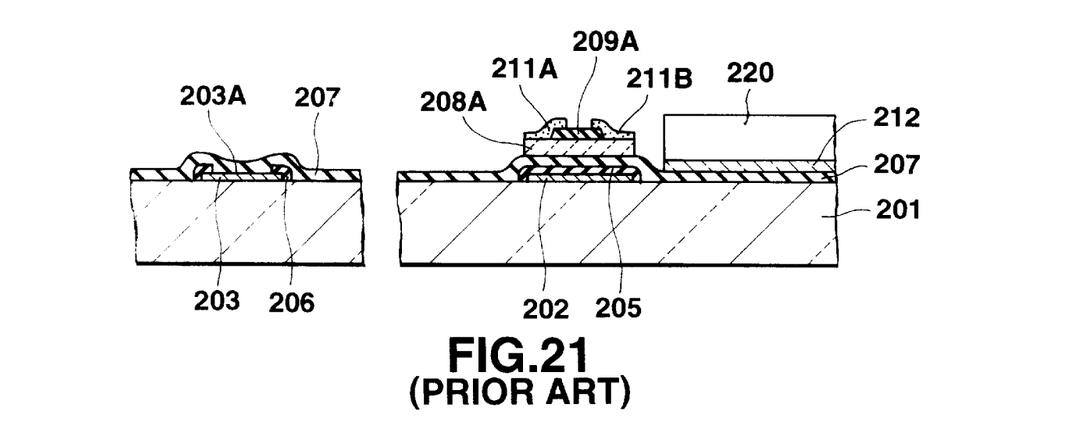
FIG. 21 is a cross sectional view illustrating a step of forming a pixel electrode.
Figure 22:
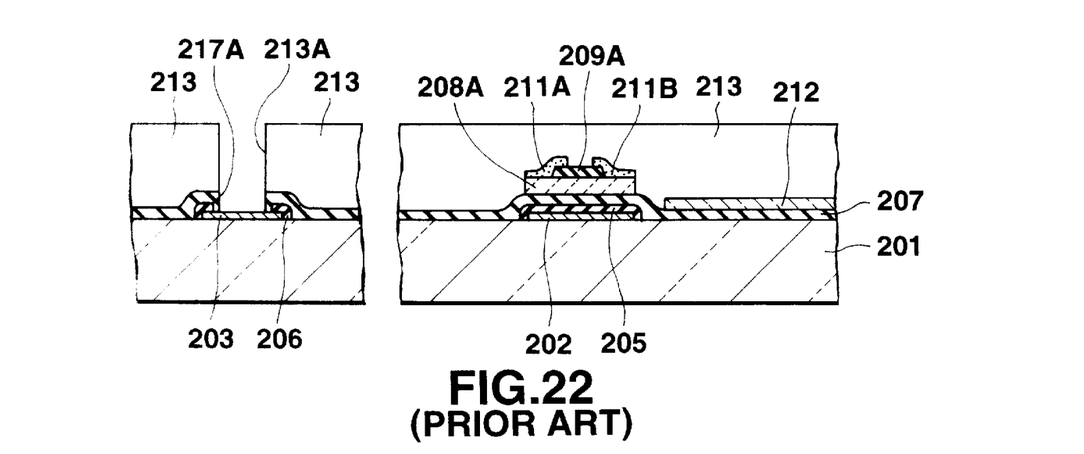
FIG. 22 is a cross sectional view illustrating a step of etching the gate insulation film.

Subsequently, for example, n$^+$-type amorphous silicon film doped with an impurity, is deposited on the blocking layer 209A and the silicon film 208. Then, as shown in FIG. 20, a selective etching is carried out such that the n$^+$-type amorphous silicon film is separated on the blocking layer 209A into a drain side and source side, thus forming impurity semiconductor islands 211A and 211B. Further, the silicon film 208 is selectively etched so as to form a semiconductor island 208A. Then, as can be seen in FIG. 21, a pixel electrode 212 made of ITO (indium tin oxide) is formed on the gate insulating film 207 by the patterning method which uses a resist mask 220. In the patterning of ITO, a wet etching technique is employed with use of a hydrochloric acid-based etching solution. Further, as shown in FIG. 22, after a resist mask 213 having a contact hole 213A is formed, an etching is performed so as to form a contact hole 207A in the gate insulation film 207 on the upper surface of the gate pad portion 203. Thus, the contact region of the gate pad 203 is exposed.

Figure 23:
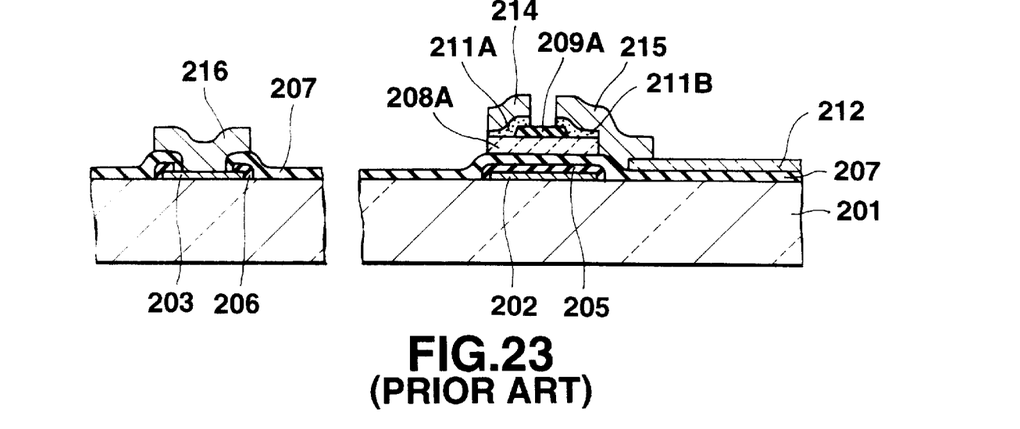
FIG. 23 is a cross sectional view illustrating a step of forming a gate pad, and source drain electrodes.
Figure 24:
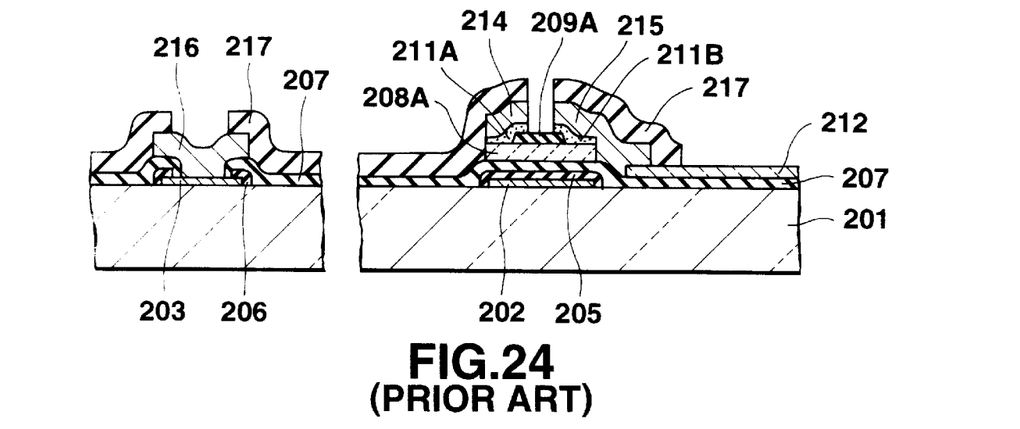
FIG. 24 is a cross sectional view illustrating a step of forming an overcoat film.

Next, the resist mask 213 is removed, and then a source-drain metal film is deposited on the entire surface. After that, a resist mask having a predetermined pattern (not shown) is formed on the metal film, and with use of this resist mask as a mask, the source-drain metal film is patterned, thus forming a source electrode 215, a drain electrode 214 and a gate pad metal film 216 as shown in FIG. 23. Then, as shown in FIG. 24, an overcoat film 217 made of, for example, silicon nitride, is formed thereon, thus completing the manufacturing process of the conventional TFT.

Figure 25:
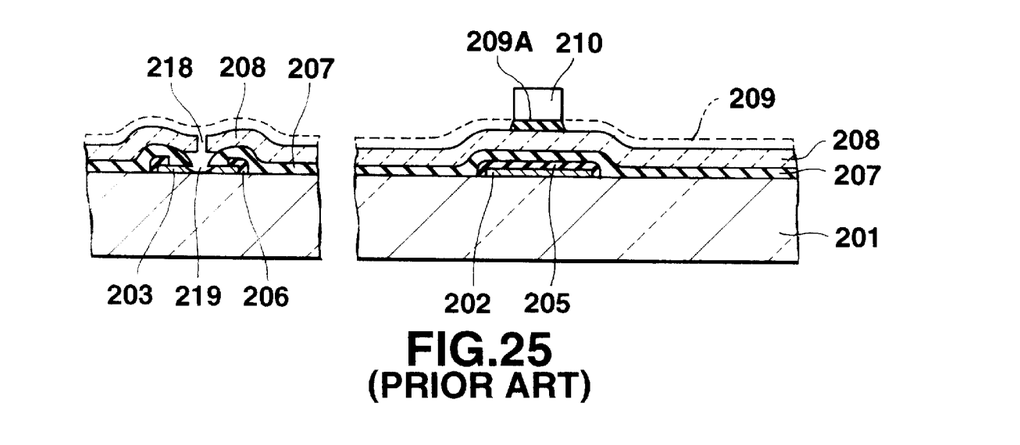
FIG. 25 is a cross sectional view showing a cavity created in the gate pad portion.

In such a conventional TFT array, terminal portions (pad portions) for connecting the gate line and the drain line to external circuits. Some of the examples of the etching solution for silicon nitride which makes the blocking layer 209A, are buffered hydrofluoric acid and hot phosphoric acid, which have a property of easily corroding aluminum or aluminum alloy. In the step of wet-etching the silicon nitride film 209 shown in FIG. 19, a pin hole 218 can be easily made in the backing silicon film 208, as an enlarged view of which is shown in FIG. 25. Therefore, when a pin hole is actually created, and the silicon film 208 is made very thin (for example, less than 1,000 angstrom), the etching solution reaches the gate insulation film 207 made of silicon nitride. As a result, a pin hole can be easily made also in the gate insulation film 207. Since the contact region 203A made on the upper surface of the gate pad portion 203 is not protected by the anodic oxidized film 4, unlike the case of the gate line or the gate electrode portion, if such a pin hole is made in the film 207, the etching solution reaches the gate pad portion 203 through the hole, so as to easily corrode it. Thus, as shown in FIG. 25, a cavity 219 is made in the gate pad portion 203, or in worse cases, the disconnection of the wiring occurs.

Further, in the step shown in FIG. 21, which is carried out after the step shown in FIG. 19, the ITO film, which gives rise to the pixel electrode 212, is etched with a hydrochloric acid-based etching solution. However, there is nothing but the gate insulation film 207 formed on the contact region 203A, and therefore, if a pin hole is made in the gate insulation film 207 as described above, the hydrochloric acid-based etching solution corrodes Al of the gate pad portion 203, which raises a problem. Especially, in the case of a metal film containing Al, projections so-called "hillock" are occasionally created when the film is heated at about 250° C. Consequently, a defect occurs more easily in the portion of the gate insulation film 207, which covers such a projecting section, than in other sections. Although the occurrence rate of film defects themselves, including the creation of a pin hole, is low, the yield of production is lowered in the case of liquid crystal display devices each having a TFT array of a finely integrated wiring structure.

BRIEF SUMMARY OF THE INVENTION

The object of the present invention is to prevent the corrosion of a connection terminal portion with an etching solution, in a method of manufacturing a transistor array.

In order to achieve this object, an aspect of the present invention provides a method of manufacturing a transistor array, comprising:

a gate electrode forming step of forming a gate electrode and a gate backing pad connected to the gate electrode, on a substrate;

an insulator forming step of forming an insulator on the gate electrode, the gate backing pad and the substrate;

a semiconductor section forming step of forming a semiconductor section having characteristics of a semiconductor, on a portion of the insulator, situated above the gate electrode;

a protection mask forming step of forming a protection mask on the gate backing pad; and a source-drain electrode forming step of forming a source electrode and a drain electrode to be separated from each other, on the semiconductor section.

With the above-described structure, the gate backing pad can be protected from the etching solution by the protection mask, and therefore an excellent transistor array can be manufactured.

Another aspect of the present invention provides a method of manufacturing a transistor array comprising:

a gate electrode forming step of forming a gate electrode and a gate terminal portion connected to the gate electrode, on a substrate;

an insulator forming step of forming an insulator on the gate electrode and the gate terminal portion;

a non-insulator forming step of forming a non-insulator on the insulator;

a protector forming step of forming a protector on a portion of the insulator, situated above the gate terminal portion; and a source-drain electrode forming step of forming a source electrode and a drain electrode to be separated from each other, on the non-insulator.

With the above-described structure, the gate terminal portion can be protected from the etching solution by the protection mask, and therefore an excellent transistor array can be manufactured.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 17 to FIG. 25 are views for illustrating a conventional method of manufacturing a TFT array in which

DETAILED DESCRIPTION OF THE INVENTION

Embodiments of the method of manufacturing a TFT array, according to the present invention will now be described with reference to accompanying drawings.

FIGS. 1 to 10 are cross sectional views illustrating an embodiment of the method of manufacturing a TFT array according to the present invention. This embodiment will describe a case where the present invention is applied to the manufacture of a reverse stagger type TFT.

Figure 1:
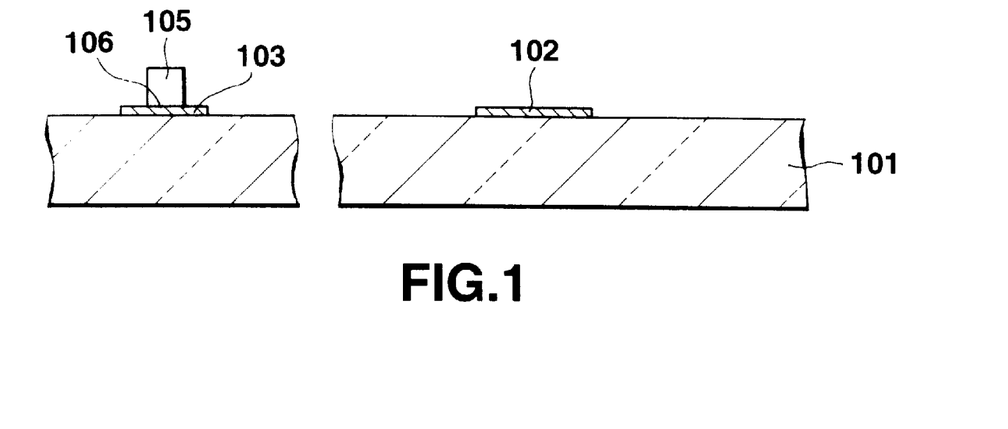
FIG. 1 is a cross sectional view illustrating a step of forming a gate metal film for a gate electrode and a gate backing pad in the method of manufacturing a TFT array, according to the present invention.

First, in this embodiment, a gate metal film made of, for example, an alloy containing aluminum and titanium, is deposited by the sputtering method on a surface of a glass substrate 101. Then, the gate metal film is patterned into a plurality of gate electrode formation sections 102 aligned in columns and rows to be arranged in matrix, a plurality of gate pad formation sections aligned along one side of a periphery of the glass substrate 101, to be connected to the terminals of external drive circuit, gate line formation sections each designed for connecting those arranged in the same column, of these gate electrode formation sections 102, to one of the gate pad formation sections 103, an auxiliary capacity electrode formation portion extending in a column direction, and an electric feeder line formation portion for anodization. The feeder line formation section for the anodization, is a wiring for supplying a voltage from an external power source, so as to anodize the surface of the gate metal film while immersing the glass substrate 101 into an electlytic solution. Next, the resultant substrate is subjected to a photolithographic process such as to leave out a resist mask on each gate pad formation portion 103, except for the periphery thereof, as can be seen in FIG. 1. In short, a resist mask 105 is formed on a contact region or central region 106 on the upper surface of each gate pad formation portion 103.

Figure 2:
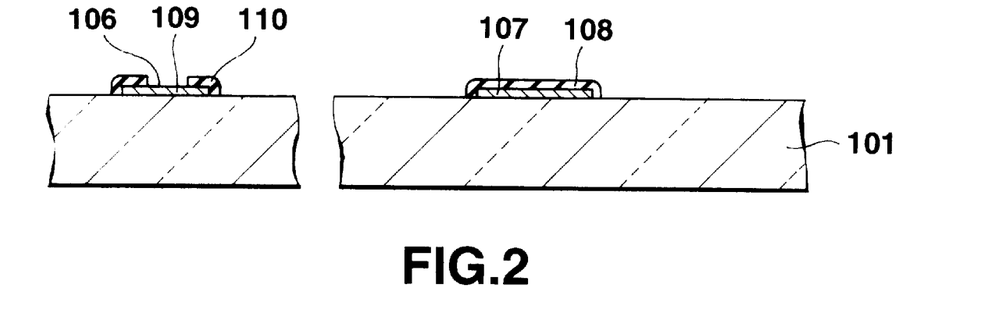
FIG. 2 is a cross sectional view illustrating a step of forming an anode oxidation (anodizing) film from the gate metal film.

Next, the resultant is subjected to an anodizing method, in which a voltage is supplied there to from an external power source. As can be seen in FIG. 2, the surface of each gate electrode formation section 102 is oxidized to form a gate electrode 107 containing aluminum and titanium, and having a thickness of 100 nm to 200 nm, and an anodic oxidized film 108 having a thickness of 120 nm to 180 nm and covering the gate electrode 107. At the same time, the surface of each gate pad formation section 103 is oxidized so as to form an anodic oxidized film 110 having a thickness of 120 nm to 180 nm and covering on the surface of the gate backing pad 109, a thickness of which is 100 nm to 200 nm, except for the contact region 106 which is covered by the resist mask 105. Further, the surface of each gate line formation section is oxidized so as to form a gate line 111 (see FIG. 7A) having a thickness of 100 nm to 200 nm and an anodic oxidized film having a thickness of 120 nm to 180 nm. At the same time, the auxiliary capacity electrode formation section is formed into an auxiliary capacity electrode 113 having a thickness of 100 nm to 120 nm, and an anodic oxidized film having a thickness of 120 nm to 180 nm, which covers the electrode. Further, the feed line formation section for the anodic oxidation, is formed eventually into a feed line and an anodic oxidation film 114 which covers the feed line (see FIG. 7A). FIG. 2 shows a state in which the resist mask 105 is removed.

Figure 3:
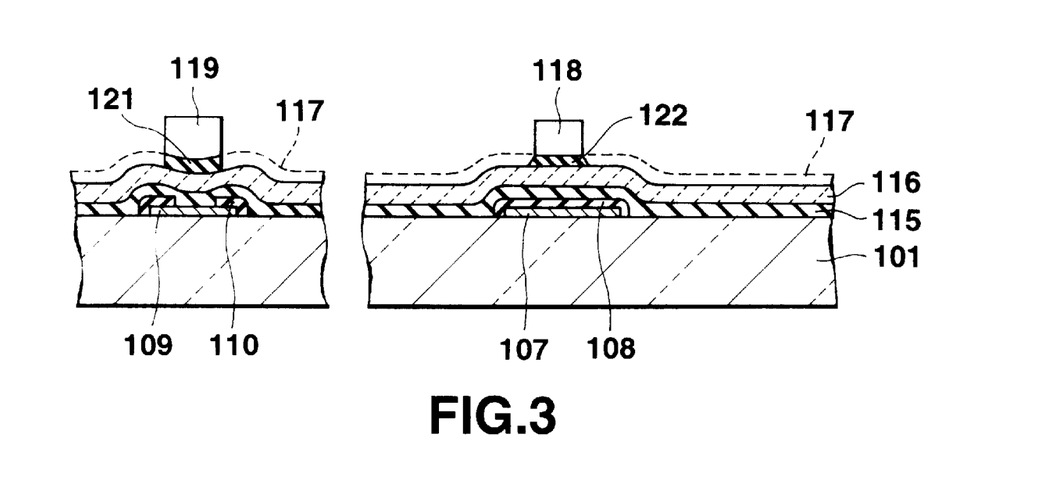
FIG. 3 is a cross sectional view illustrating a step of forming a protective insulating layer above a gate backing pad.

After that, as shown in FIG. 3, a gate insulation film 115 made of silicon nitride and having a thickness of 200 nm to 300 nm, a silicon film 116 made of amorphous silicon or polycrystal silicon and having a thickness of 20 nm to 75 nm, and an insulation film 117 for forming a blocking layer, made of silicon nitride and having a thickness of 100 mm to 170 nm, are deposited in the order by the plasma CVD method on the upper surface side of the substrate 101. Then, as can be seen in the same figure, a resist mask 118 is formed by patterning on the portion of the insulation film 117, which is located above the gate electrode 107, and a resist mask 119 is formed by patterning on the portion of the insulation film 117, which is located above the gate backing pad 109. It should be noted that the resist mask 118 is formed such that it traverses, in the channel width direction, the center which corresponds to an intrinsic semiconductor island 120 which is patterned as the silicon film 116, which will be explained later, crosses over the gate electrode 107. The resist mask 119 is formed such that it completely covers the contact region 106, which is the portion situated on the gate backing pad 109, and not covered by the anodic oxidized film 110, and also that the mask 119 is situated within an outline of the anodic oxidized film 110, as viewed from straight above.

After that, the backing blocking layer-forming insulation film 117 is wet-etched using the resist masks 118 and 119 as masks, to form the protective insulation layer 121 and a blocking layer 122. As an etching solution for wet-etching, buffered hydrochloric acid is used. In the wet-etching, the contact region 106 of the gate backing pad 109 is protected not only by the gate insulation film 115 and the silicon film 116, but also by a resist mask 119 and a protective insulation layer 121 covered by the resist mask 119. Therefore, just in case where some defect such as pin hole or holes occur in the backing silicon film 116, the etching solution never reaches the gate insulation film 115 due to the protective insulation layer 121 which prevents the leaking of the etching solution to the silicon film 116. Consequently, the gate backing pad 109 made of Al alloy is never corroded with the etching solution.

Figure 4:
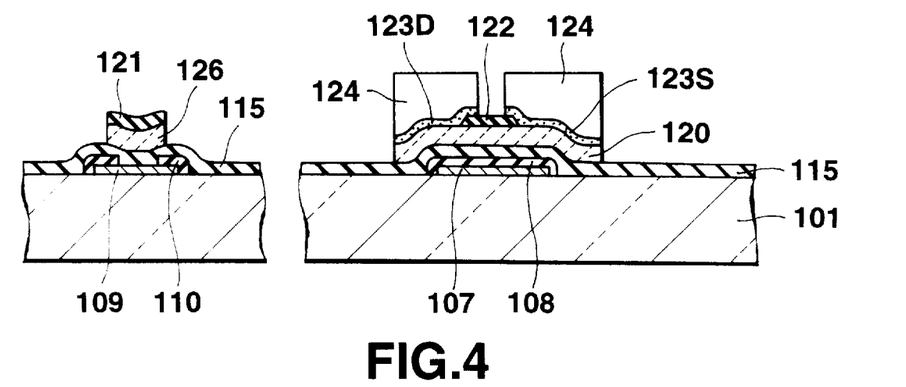
FIG. 4 is a cross sectional view illustrating a step of forming a protective insulation layer above the gate backing pad.

Next, the resist masks 118 and 119 are removed, and an impurity-doped semiconductor film made of $n^+$-type amorphous silicon and having a thickness of 20 nm to 30 nm, is deposited by the CVD method on the upper side of the substrate. Then, as can be seen in FIG. 4, the semiconductor film is subjected to the dry etching with a chlorine-based gas, using a resist mask 124, so as to separate the film into a source side and a drain side on the blocking layer 122 situated above the gate electrode 107, thus forming impurity-doped semiconductor islands 123A and 123D. Then, continuously, an anisotropic dry etching is carried out using the resist mask 124 and the blocking layer 122 as masks, so as to pattern the silicon film 116, thus forming an intrinsic semiconductor island 120. Consequently, the intrinsic semiconductor island 120 remains in the form of island, above the gate electrode 107. The etching gas used for the dry etching should be of a type capable of etching amorphous silicon which constitutes the impurity-doped semiconductor islands 123S and 123D, and the silicon film 116, and having a high selection ratio for silicon nitride which constitutes the gate insulation film 115 and the blocking layer 122, and for example, a mixture gas of carbon tetrachloride ($CCl_4$) and oxygen ($O_2$). During the anisotropic dry etching, the protective insulation film 121 formed above the gate backing pad 109 and made of silicon nitride, serves as a mask, and thus the silicon film 116 situated underneath the protective insulation layer 121 remains without being etched, thus forming a protective semiconductor layer 126. As an alternative, it is possible that a protective impurity semiconductor layer 127 made of $n^+$-type amorphous silicon is formed at the same time with the formation of the impurity doped semiconductor islands 123S and 123D using the resist mask 125 formed together with the resist mask 124, as a mask, so as to pattern a protective impurity semiconductor layer 126, using the resist mask 125, the protective impurity semiconductor layer 127 and the protective insulation layer 121 as masks.

Figure 5:
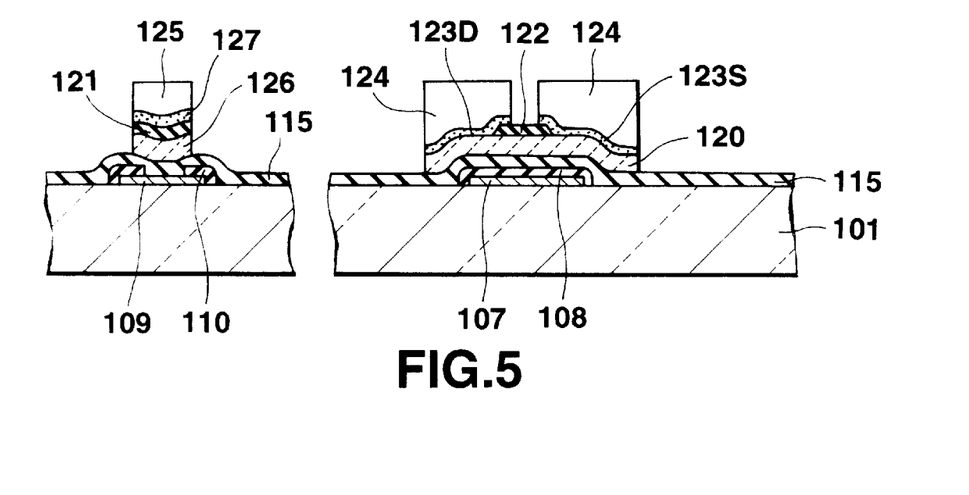
FIG. 5 shows an alternative to the step illustrated in FIG. 4 and is a cross sectional view illustrating a step of forming a protective semiconductor layer, a protective insulating layer and a protective impurity-doped semiconductor layer, above the gate backing pad.
Figure 6:
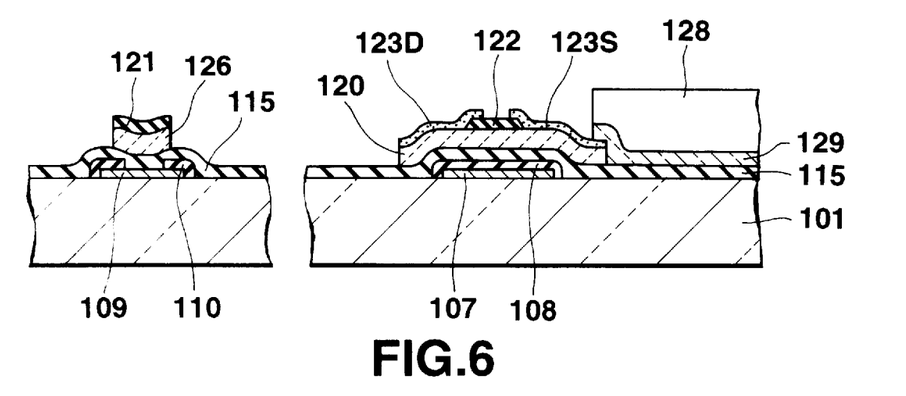
FIG. 6 is a cross sectional view illustrating a step of forming a pixel electrode.

It should be noted that the figures are diagrams illustrating the steps from FIG. 6 onwards, which follows the step shown in FIG. 4, and when the protective impurity semiconductor layer 127 is formed on the protective insulation layer 121 in the figures from FIG. 6 onwards, the steps from FIG. 5 onwards can be explained in a similar way to the above.

After the resist mask 124 (FIG. 4) or the resist masks 124 and 125 (FIG. 5) are removed, an ITO film is deposited on the entire surface. Then, a resist mask as shown in FIG. 6 is formed by patterning, and with this mask, a wet-etching is carried out, so as to form a pixel electrode 129 having a thickness of 30 nm to 100 nm on the gate insulation film 115 such that it partially overlaps with the impurity doped semiconductor island 123S. For the wet-etching of the ITO film, a hydrochloric acid/nitric acid-based etching solution is used. An etching solution of this type has a very high etching rate for Al alloys, and therefore conventionally entails the problem where, if a film defect occurs in the gate insulation film 115, the etching solution corrodes the contact region 106 of the gate backing pad 109, causing the disconnection of the wiring. However, in this embodiment, the protective semiconductor layer 126 and the protective insulation layer 121 formed on the section of the gate insulation film 115, which is situated above the gate backing pad 109, can shut off the etching solution from entering the gate insulation film 115. Thus, the gate backing pad 109 can be protected from being etched with the etching solution.

Figure 7A:
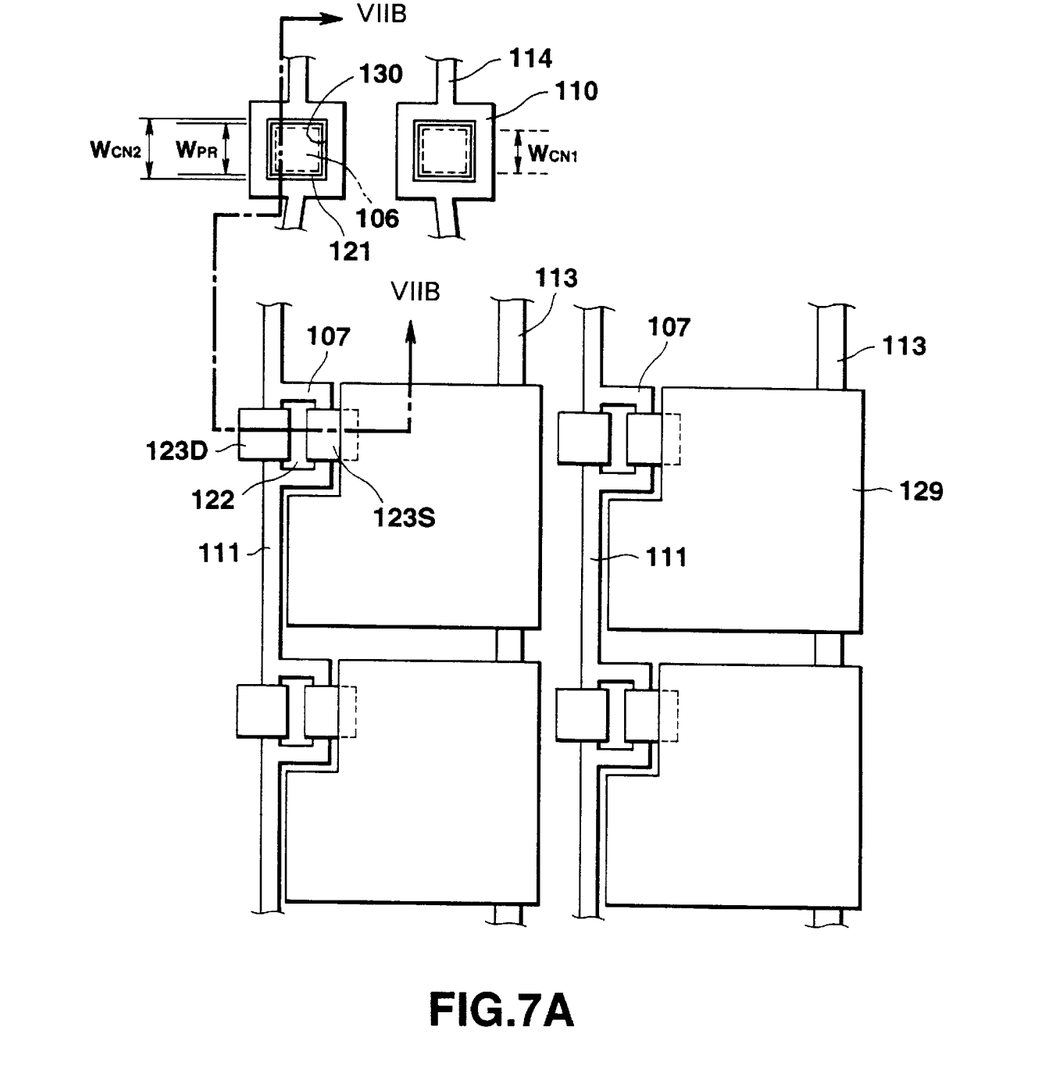
FIG. 7A is a diagram illustrating a step of forming a resist mask having an opening which is wider than the protective semiconductor layer and the protective insulation layer, except for a part of a photoresist.
Figure 7B:
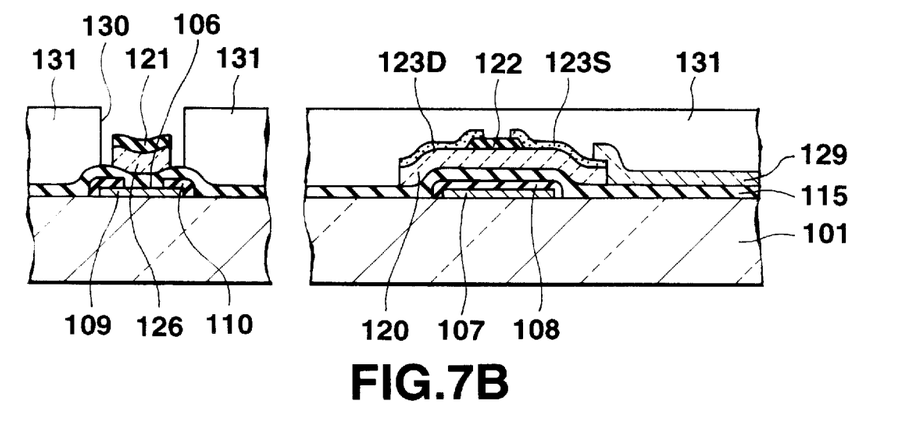
FIG. 7B is a cross sectional view taken along the line VIIB—VIIB in FIG. 7A, including the photoresist formed.

Next, the steps which follow the removal of the resist mask 128 will now be described with reference to FIGS. 7A and 7B. FIG. 7A is a plan view of the transistor array from straight above, and FIG. 7B is a cross sectional view taken along the line VIIB—VIIB in FIG. 7A.

A resist mask 131 having an opening 130 only at the section above the gate backing pad 109, is formed by patterning. The inner side wall of the opening 130 is situated on a further outer side to the side walls of the protective semiconductor layer 126 and the protective insulation layer 121, formed above the gate backing pad 109, but on an inner side to the outline of the gate backing pad 109. In other words, a width $W_{PR}$ of one side of the protective semiconductor layer 126 and the protective insulation layer 121 is set to be larger than one side of the contact region 106 of the gate backing pad 109, and a width $W_{CN2}$ of one side of the opening 130 is set to be larger than the width $W_{CN1}$. That is, the inner side wall of the opening 130 of the resist mask 131 is formed to surround the protective semiconductor layer 126 and the protective insulation layer 121 with a certain gap between its inner side wall and the side walls of these layers, and also to be situated above the anodic oxidized film 110. Subsequently, using the resist mask 131 thus patterned as a mask, a dry-etching is carried out. Examples of the gas used for the dry etching are fluorine-based gases such as sulfur hexafluoride ($SF_6$) and carbon tetrafluoride ($CF_4$).

Figure 8:
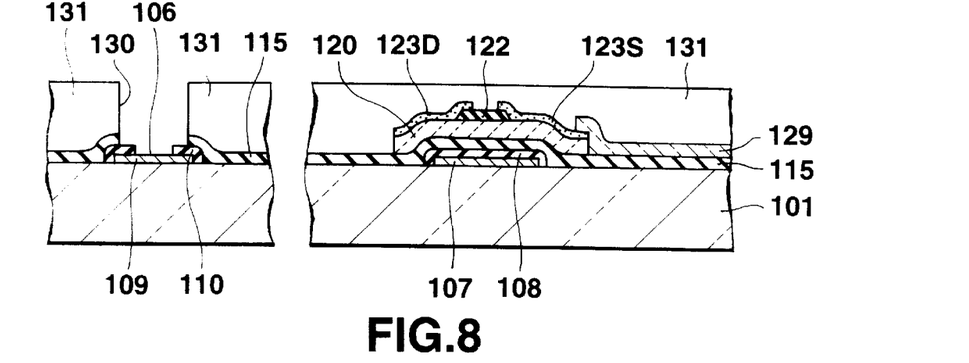
FIG. 8 is a cross sectional view illustrating a step of etching the gate insulation film.

The result of this etching is shown in FIG. 8, in which the portions of the protective insulation layer 121, the protective semiconductor layer 126 and the gate insulation film 115, which are situated on the gate backing pad 109, have been removed, and the contact region 106 of the gate backing pad 109 made of the Al alloy has been exposed.

Figure 9:
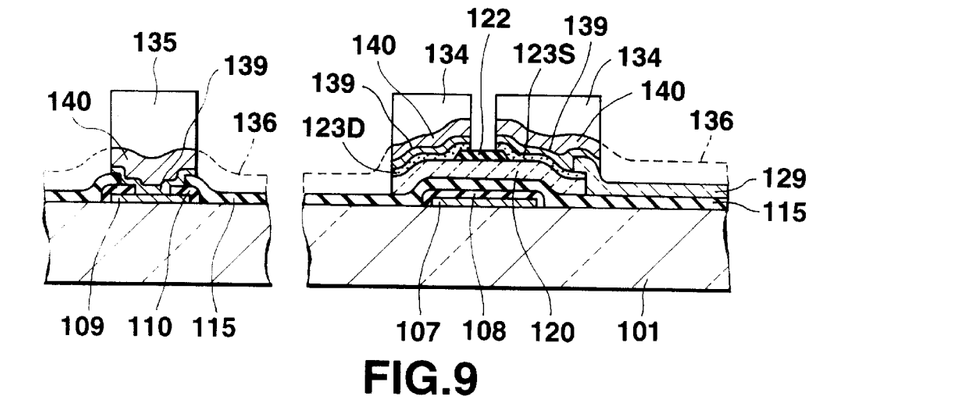
FIG. 9 is a cross sectional view illustrating a step of forming a gate pad.

After that, the resist mask 131 is removed, and then as can be seen in FIG. 9, a first metal film 139 made of, for example, chromium (Cr) and having a thickness of 10 nm to 30 nm is deposited on the entire surface, and a second metal film 140 containing Al and Ti and having a thickness of 330 nm to 400 nm is deposited on the first metal film 139, both by the sputtering method, thus forming data wiring films 136. Then, a resist mask 134 and another resist mask 135 are formed on the portions of the data wiring films 136, which are situated above the source-drain region and the gate underlaying pad 109, respectively. With these resist masks 134 and 135 being used as masks, an etching is carried out, and thus forming a source electrode 137S, a drain electrode 137D, a drain line 145 for connecting drain lines to each other in a row direction, and a gate pad 138 as shown in FIGS. 10A and 10B.

Figure 10A:
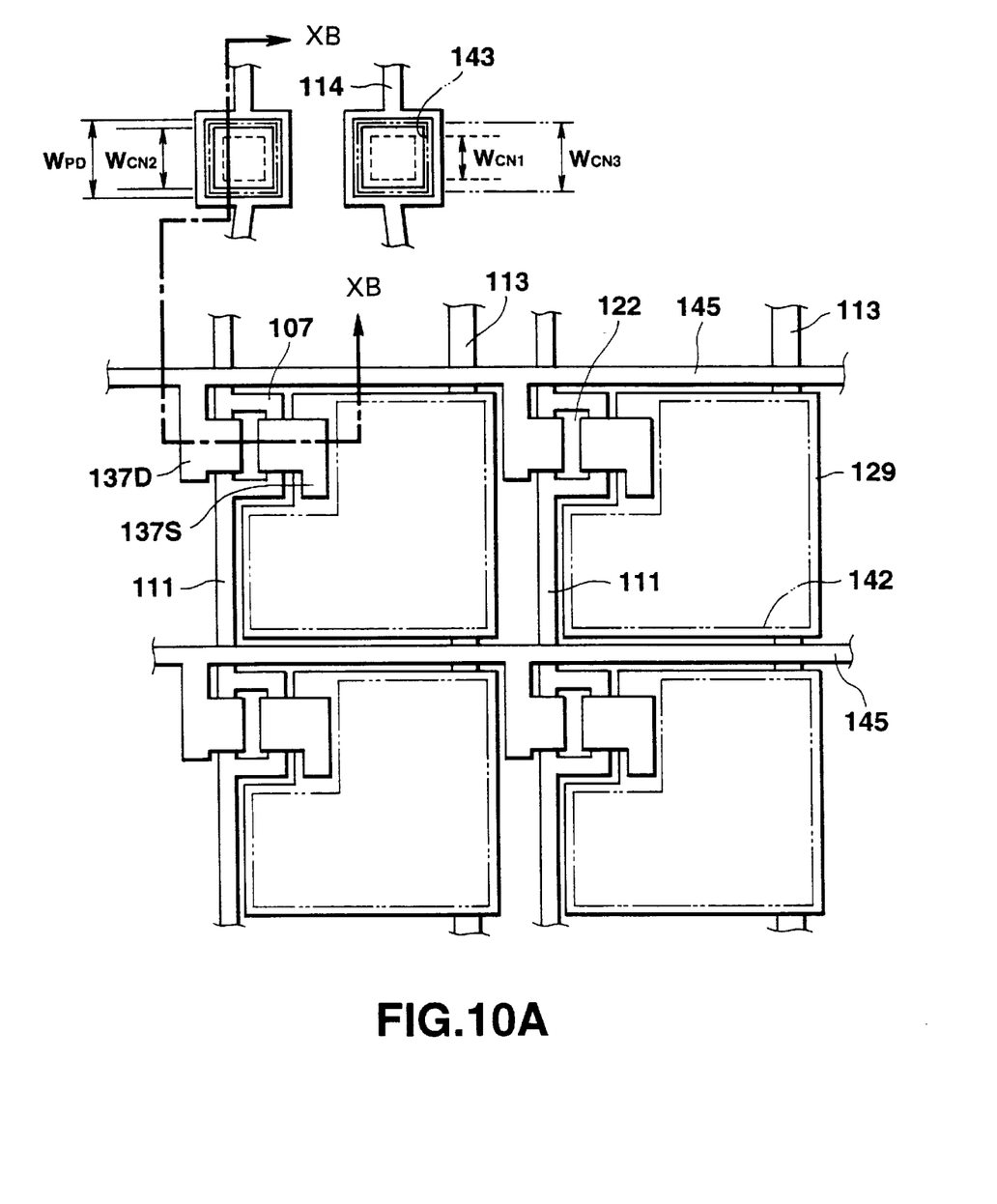
FIG. 10A is a diagram illustrating a step of forming an overcoat film.
Figure 10B:
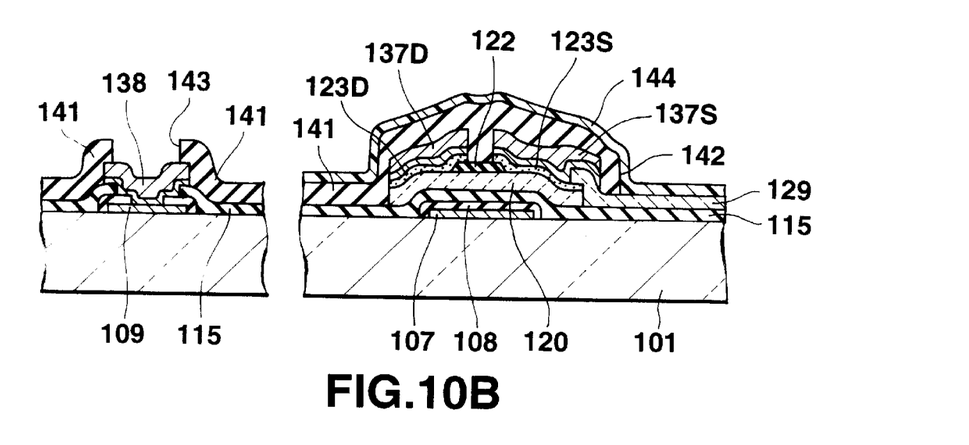
FIG. 10B is a cross sectional view taken along the line XB—XB in FIG. 10A.

FIG. 10A is a plan view of the transistor array from straight above, and FIG. 10B is a cross sectional view taken along the line XB—XB in FIG. 10A. As can be seen in FIG. 10B, an overcoat film 141 made of silicon nitride, having a thickness of 100 nm to 300 nm, and having an opening 142 which exposes a region for the pixel electrode 129 and an opening 143 which exposes a region for the gate pad 138, is formed. Then, the drain pads connected to the gate pad 138 and the drain electrode 137D are removed, and an alignment film 144 used for the initial alignment of liquid crystal molecules is deposited.

It should be noted that a width $W_{CN1}$ of the contact region 106, a width $W_{CN2}$ of the opening of the gate insulation film 115, which is also the width of the opening 130, a width $W_{CN3}$ of the opening 143 and a width $W_{PD}$ of the gate pad 138 are set to satisfy the following relationship:

$$W_{CN1} < W_{CN2} < W_{CN3} < W_{PD}$$

In the manufacture of a TFT carried out in the above-described procedure, the problem that the gate backing pad 109 is corroded with the etching solution, which easily causes the disconnection of the wiring, can be effectively suppressed. Consequently, the production yield of an electronic device having TFT's, such as a liquid crystal display device, can be improved.

Figure 11:
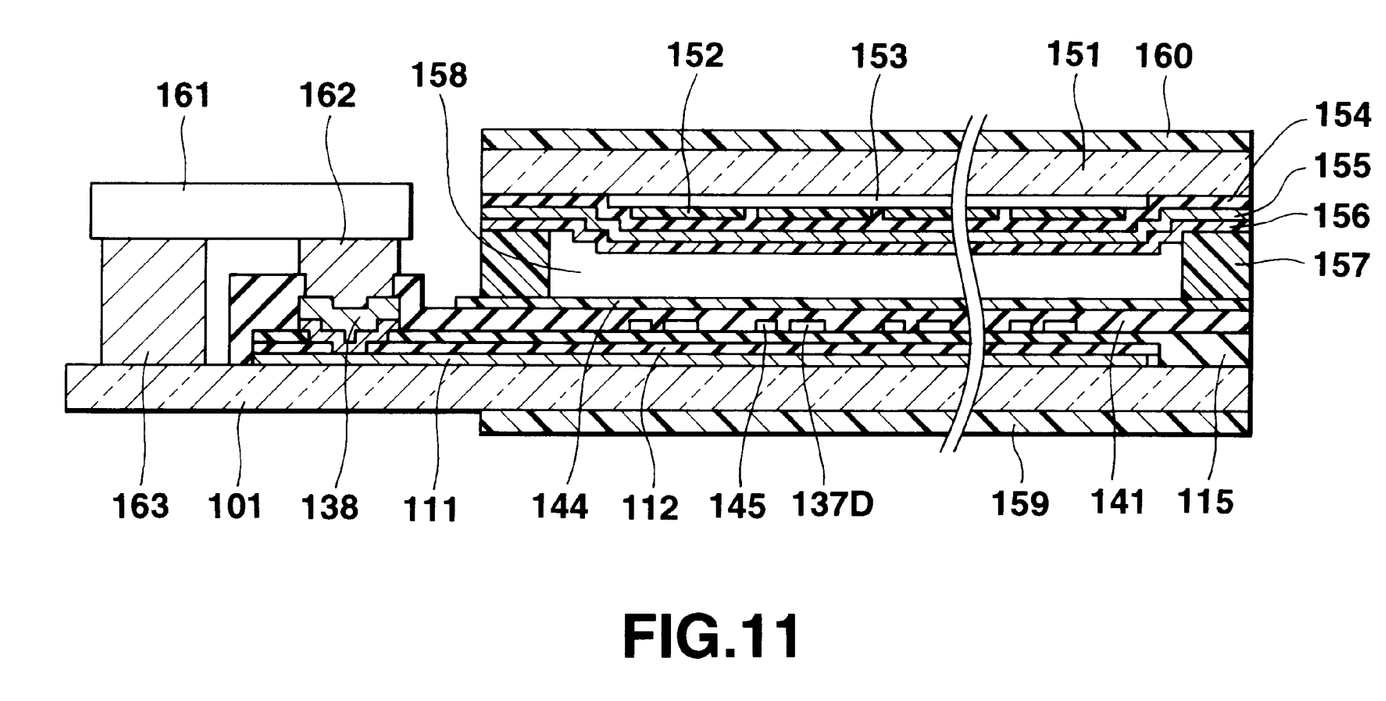
FIG. 11 is a cross sectional view showing a liquid crystal display apparatus to which a thin film transistor array of the present invention is applied.

FIG. 11 shows an example in which a thin film transistor array manufactured as above is applied in a liquid crystal display device.

On the surface side of a glass substrate 151, which faces a glass substrate 101, red, green and blue color filters 152 are arranged to correspond to pixel electrodes 129. Further, between adjacent color filters 152, that is, in the regions corresponding to a thin film transistor, a drain line 145 and a gate line 111, which are covered by the overcoat film 141, a black mask 153 having an shading property, is provided. Further, an insulation film 154 is formed on the entire surfaces of the color filters 152 and the black mask 153, and a common electrode 155 made of ITO is formed on the surface of the insulation film 154. An alignment film 156 is formed on the surface of the common electrode 155, and a sealing member 157 provided between the alignment films 156 and 144 such as to surround the display region, serves to join the thin film transistor array substrate 101 and the glass substrate to each other. In the space defined by the alignment films 144 and 156, and the sealing member 157, a liquid crystal 158, which is initially aligned in accordance with the alignment films 144 and 156, is provided. Polarizing plates 159 and 160, each having a linear polarizing axis set in a predetermined direction, are situated on outer surface sides of the glass substrates 101 and 151, respectively. A gate pad 138 is joined each terminal 162 of the drive circuit 161 which outputs a scanning signal for addressing the thin film transistor to the gate line 111. Further, a dummy terminal 163 of the drive circuit 161 is joined to the glass substrate 101.

Figure 12:
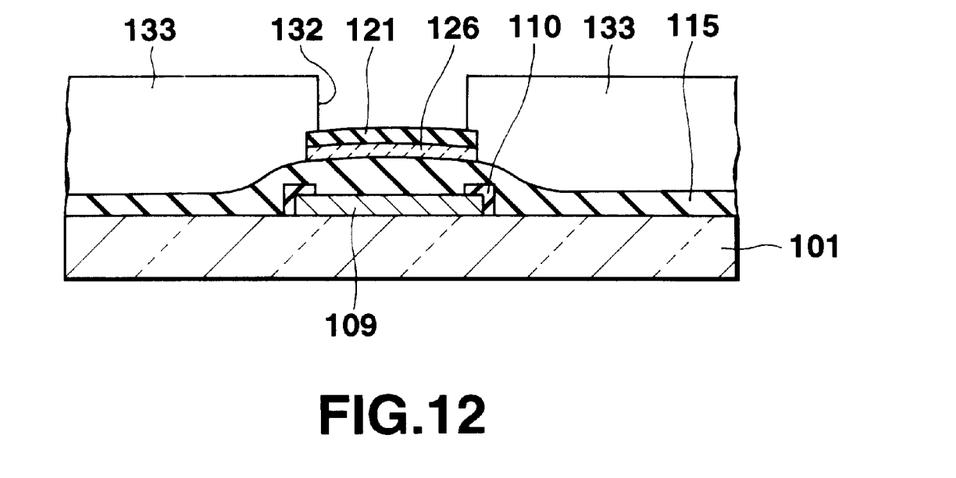
FIG. 12 is a cross sectional view illustrating a comparative example in which a resist mask having an opening which is narrower than the protective semiconductor layer and the protective insulation layer, is formed.
Figure 13:
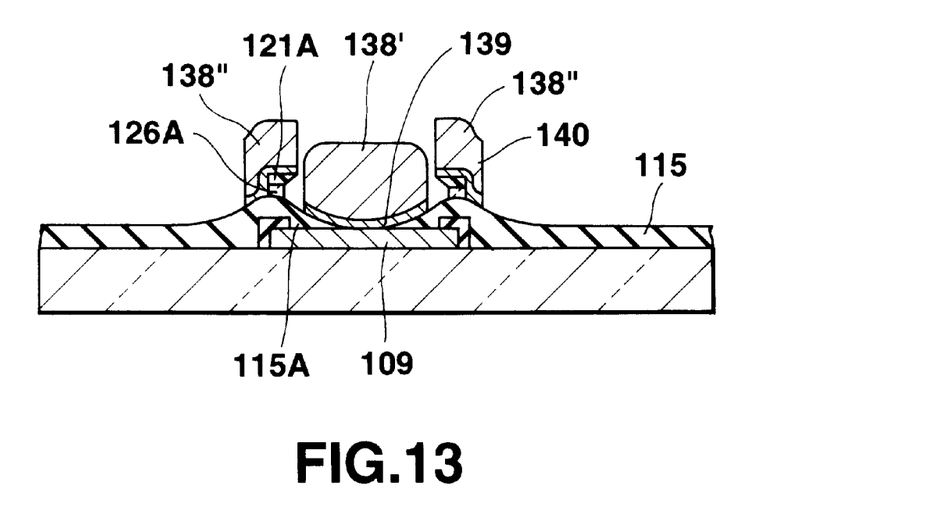
FIG. 13 is a cross sectional view illustrating a gate pad of which, the electrical conductivity is deteriorated due to the step shown in FIG. 12.

FIG. 12 shows a comparative example where a resist mask 133 having an opening 132 with a width smaller than that of the protective insulation layer 121 and the protective semiconductor layer 126, and partially overlapping with the protective insulation layer 121 and the protective semiconductor layer 126, is used in place of the resist mask 131 having an opening 130 with a width larger than that of the protective insulation layer 121 and the protective semiconductor layer 126 in the steps shown in FIGS. 7A and 7B. When the resist mask 133 having the opening 132 whose area is smaller than that of the protective insulation layer 121 and the protective semiconductor layer 126, is formed, the etching rate varies. As a result, an up-side-down tapered residue 121A of the protective insulation layer 121 is created, and further a residue 115A is inevitably created underneath a residue 126A of the protective semiconductor layer. The gate pad 138' and the gate pad 138" are separated from each other due to the residues 121A and 126A, and the contact area between the gate backing pad 109 and the gate pad 138' is decreased due to the residue 115A, thus deteriorating its electro-conductivity and making it difficult to fully function as a thin film transistor array.

Figure 14:
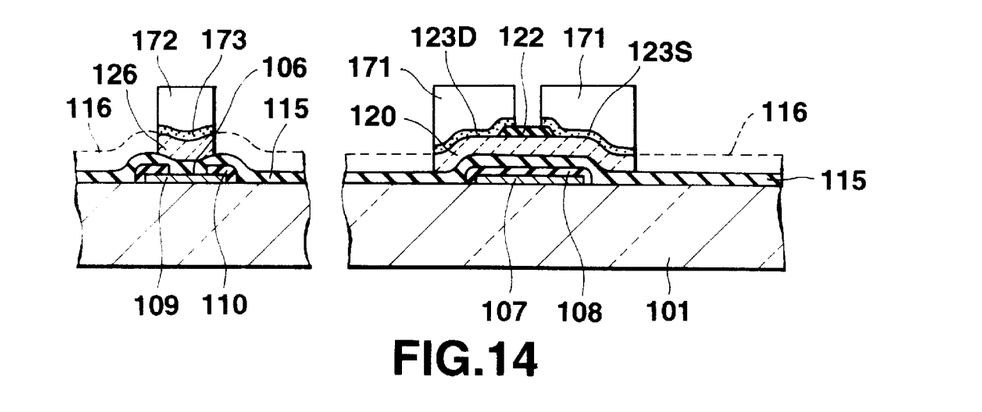
FIG. 14 is a cross sectional view illustrating a step of forming a protective semiconductor layer and a protective impurity doped semiconductor layer in the method of manufacturing a TFT array according to another embodiment of the present invention.
Figure 15:
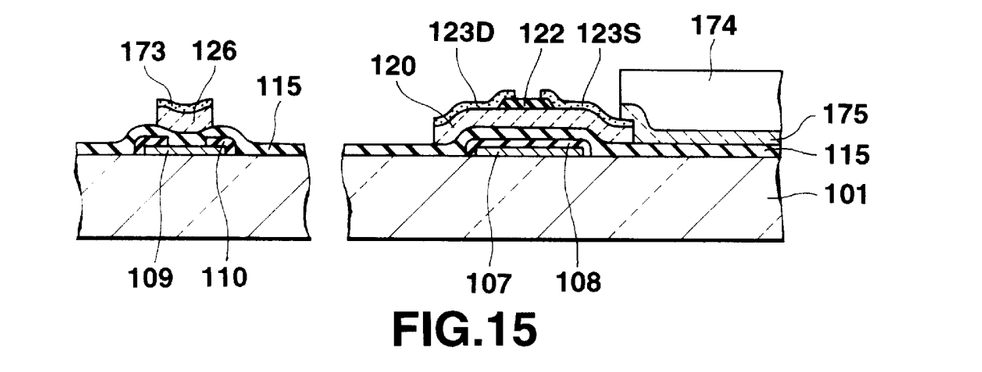
FIG. 15 is a cross sectional view illustrating a step of forming a pixel electrode.
Figure 16:
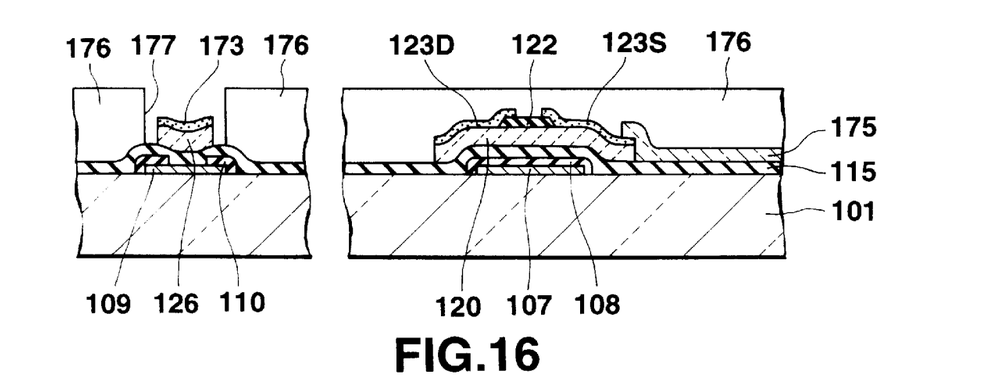
FIG. 16 is a diagram illustrating a step of forming a resist mask having an opening which is wider than the protective semiconductor layer and the protective impurity doped semiconductor layer.

FIGS. 14 to 16 are cross sectional views showing another embodiment of the method of manufacturing a TFT array, according to the present invention. In this embodiment, structural elements similar to those of the above-described embodiment will be designated by the same reference numerals, and the detailed descriptions therefor will not be repeated. Further, the descriptions of the same steps as those in the above embodiment will be omitted.

In this embodiment, as can be seen in FIG. 14, a silicon film 116 is deposited, and then a blocking layer 122 is formed above a gate electrode 107 only, not above a gate backing pad 109. Subsequently, an impurity-doped semiconductor layer is deposited on the blocking layer 122 and the silicon film 116, and then separated on the blocking layer 122 by resist masks 171 and 172, into impurity-doped semiconductor islands 123S and 123D. At the same time, a protective impurity-doped semiconductor layer 173 is formed on a protective semiconductor layer 126. Immediately after that, the silicon film 116 is etched, thus forming intrinsic semiconductor island 120 and a protective semiconductor layer 126. Since the resist mask 172 formed above the gate backing pad 109 is designed to cover a contact region 106 completely, and naturally, the protective semiconductor layer 126 and the protective semiconductor layer 173 completely covers the contact region 106.

Next, as can be seen in FIG. 15, the resist masks 171 and 172 are removed, and then an ITO film is deposited on the entire surface. Further, the resist mask 174 is newly formed by patterning, and the ITO film is subjected to wet-etching, thus forming a pixel electrode 174. The etching solution for the wet-etching is of a hydrochloric acid/nitric acid-based type, as in the case of the previous embodiment. During the wet-etching, the protective semiconductor layer 173 and the protective semiconductor layer 126 serve to protect the gate insulation film 115, above the gate backing pad 109, and therefore the gate backing pad 109 will never be corroded with the etching solution.

After that, as can be seen in FIG. 16, a new resist mask 176 is formed by patterning. The shape of the resist mask 176 is similar to that of the previous embodiment, and more specifically, an opening 177 is made such as to surround the side walls of the protective semiconductor layers 173 and 126 with a certain gap between the side walls and the periphery of the opening. With use of the resist mask 176 as a mask, the protective semiconductor layers 126 and 173, the silicon film 116 and the gate insulation film 115 are subjected to dry etching, thus forming a structure similar to that of the previous embodiment, shown in FIG. 8. The steps which follow the above, will be the same as those of the previous embodiment. In this embodiment, it is possible to prevent the corrosion of the gate backing pad 109 with the etching solution during the formation of the pixel electrode 175.

Thus, the details of the present invention were described in connection with the method of manufacturing a thin film transistor array; however the present invention is not limited to the above-described embodiments. More specifically, it can be modified into many different versions by changing elements of the structure, for example, the materials, the structure of the TFT and the electronic device to which the present invention is applied. Further, in these embodiment, the gate backing pad 109 is described as an external terminal; however the present invention can be applied also to a connection terminal portion of a static protective element. Furthermore, the gate insulation film may be formed directly on the gate electrode and the gate backing pad, without anodizing the gate metal. The pixel electrode may not be formed between the impurity doped semiconductor island and the source electrode, but it is possible that the source electrode is formed on the impurity semiconductor island, and the pixel electrode is formed on the source electrode.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

We claim:

1. A method of manufacturing a transistor array, comprising:
   a gate electrode forming step of forming a gate electrode and a gate backing pad connected to the gate electrode, on a substrate;
   an insulator forming step of forming an insulator on said gate electrode, said gate backing pad and said substrate;
   a semiconductor section forming step of forming a semiconductor section having characteristics of a semiconductor, on a portion of said insulator, situated above said gate electrode;
   a protection mask forming step of forming a protection mask on said gate backing pad, said protection mask including an intrinsic amorphous silicon layer and an insulation layer; and
   a source-drain electrode forming step of forming a source electrode and a drain electrode to be separated from each other, on the semiconductor section.

2. A manufacturing method according to claim 1, further comprising a pixel electrode forming step of forming a pixel electrode on said insulator formed on said substrate by forming a conductive layer on said protection mask and the insulator, and then patterning said conductive layer.

3. A manufacturing method according to claim 2, wherein said pixel electrode forming step includes a step of subjecting said conductive layer to wet-etching.

4. A manufacturing method according to claim 3, wherein said wet-etching is carried out with use of a hydrochloric acid-based etching solution.

5. A manufacturing method according to claim 2, wherein said conductive layer contains indium tin oxide.

6. A manufacturing method according to claim 1, wherein said insulator contains silicon nitride.

7. A manufacturing method according to claim 1, wherein said gate backing pad contains aluminum.

8. A manufacturing method according to claim 1, wherein said semiconductor section contains amorphous silicon.

9. A manufacturing method according to claim 1, wherein said semiconductor section contains $n^+$-type amorphous silicon.

10. A manufacturing method according to claim 1, further comprising:
    a pixel electrode forming step of forming a pixel electrode on said substrate by forming a conductive layer on said protection mask and said insulator and then patterning said conductive layer; and
    a contact region exposing step of removing said protection mask and exposing a contact region of said gate backing pad by performing an etching with use of an etching mask having an opening which exposes an upper surface and a side wall of said protection mask, after said pixel electrode forming step.

11. A manufacturing method according to claim 1, wherein said protection mask includes said intrinsic amorphous silicon layer, said insulation layer and an n+-type amorphous silicon layer.

12. A manufacturing method according to claim 1, wherein said source-drain electrode forming step includes a step of forming a gate pad on a contact region of said gate backing pad.

13. A manufacturing method according to claim 1, wherein said semiconductor section contains an intrinsic amorphous silicon island, and a plurality of n+-type amorphous silicon islands, and said semiconductor forming step comprises forming the intrinsic amorphous silicon island on said insulator, and forming the plurality of n+-type amorphous silicon islands on said intrinsic amorphous silicon island to be separated from each other.

14. A manufacturing method according to claim 1, wherein said semiconductor section forming step and said protection mask forming step, include the steps of:
   (a) forming a continuous intrinsic amorphous silicon film and a continuous insulation film consecutively on said gate electrode and said gate backing pad;
   (b) forming a blocking layer on a portion of said continuous intrinsic amorphous silicon film, which is situated above said gate electrode, by patterning said continuous insulation film;
   (c) forming a protective insulation layer included in said protection mask, on a portion of said continuous intrinsic amorphous silicon film, which is situated above said gate backing pad, by patterning said continuous insulation film;
   (d) forming an n+-type amorphous silicon island included in said semiconductor section, on a portion of said continuous intrinsic amorphous silicon film, which is situated above said gate electrode;
   (e) forming an intrinsic amorphous silicon island included in said semiconductor section together with said n+-type amorphous silicon island, which is situated above said gate electrode, by patterning said continuous intrinsic amorphous silicon film; and
   (f) forming a protective semiconductor layer included in said protection mask together with said protective insulation layer, which is situated above said gate backing pad, by patterning said continuous intrinsic amorphous silicon film.

15. A manufacturing method according to claim 1, wherein said insulator contains an anodic oxidized insulation film formed on said gate electrode and on a surface of said gate backing pad, which excludes a contact region on said gate backing pad, and a gate insulation film formed on said anodic oxidized insulation film.

16. A manufacturing method according to claim 1, wherein said protection mask is formed so as to cover a contact region of said gate backing pad via said insulator.

17. A method-of manufacturing a transistor array comprising:
   a gate electrode forming step of forming a gate electrode and a gate terminal portion connected to the gate electrode, on a substrate;
   an insulator forming step of forming an insulator on the gate electrode and the gate terminal portion;
   a non-insulator forming step of forming a non-insulator on the insulator;
   a protector forming step of forming a protector on a portion of the insulator, situated above the gate terminal portion, said protector containing a non-insulator island and an n+-type semiconductor island; and
   a source-drain electrode forming step of forming a source electrode and a drain electrode to be separated from each other, on the non-insulator.

18. A manufacturing method according to claim 17, further comprising a pixel electrode forming step of forming a pixel electrode to be connected one of said non-insulator and said source electrode, after said non-insulator forming step.

19. A manufacturing method according to claim 17, wherein said non-insulator island contains an intrinsic semiconductor.

20. A method of manufacturing a transistor array, comprising;
   a gate electrode forming step of forming a gate electrode and a gate backing pad connected to the gate electrode, on a substrate;
   an insulator forming step of forming an insulator on said gate electrode, said gate backing pad and said substrate;
   a semiconductor section forming step of forming a semiconductor section having characteristics of a semiconductor, on a portion of said insulator, situated above said gate electrode;
   a protection mask forming step of forming a protection mask on said gate backing pad, said protection mask including an intrinsic amorphous silicon layer, an insulation layer and an n+-type amorphous silicon layer; and
   a source-drain electrode forming step of forming a source electrode and a drain electrode to be separated from each other, on the semiconductor section.

21. A manufacturing method according to claim 20, further comprising:
   a pixel electrode forming step of forming a pixel electrode on said insulator on said substrate by forming a conductive layer on said protection mask and said insulator and then patterning said conductive layer; and
   a contact region exposing step of removing said protection mask and exposing a contact region of said gate backing pad by performing an etching with use of an etching mask having an opening which exposes an upper surface and a side wall of said protection mask, after said pixel electrode forming step.

22. A method of manufacturing a transistor array, comprising:
   a gate electrode forming step of forming a gate electrode and a gate backing pad connected to the gate electrode, on a substrate;
   an insulator forming step of forming an insulator on said gate electrode, said gate backing pad and said substrate;
   a semiconductor section forming step of forming a semiconductor section having characteristics of a semiconductor, on a portion of said insulator, situated above said gate electrode;
   a protection mask forming step of forming a protection mask on said gate backing pad; and
   a source-drain electrode forming step of forming a source electrode and a drain electrode to be separated from each other, on the semiconductor section;
   wherein said semiconductor section forming step and said protection mask forming step, include the steps of:
      (a) forming a continuous intrinsic amorphous silicon film and a continuous insulation film consecutively on said gate electrode and said gate backing pad;

(b) forming a blocking layer on a portion of said continuous intrinsic amorphous silicon film, which is situated above said gate electrode, by patterning said continuous insulation film;

(c) forming a protective insulation layer included in said protection mask, on a portion of said continuous intrinsic amorphous silicon film, which is situated above said gate backing pad, by patterning said continuous insulation film;

(d) forming an n+-type amorphous silicon island included in said semiconductor section, on a portion of said continuous intrinsic amorphous silicon film, which is situated above said gate electrode;

(e) forming an intrinsic amorphous silicon island included in said semiconductor section together with said n+-type amorphous silicon island, which is situated above said gate electrode, by patterning said continuous intrinsic amorphous silicon film; and (f) forming a protective semiconductor layer included in said protection mask together with said protective insulation layer, which is situated above said gate backing pad, by patterning said continuous intrinsic amorphous silicon film.

23. A manufacturing method according to claim 22, further comprising:

a pixel electrode forming step of forming a pixel electrode on said insulator on said substrate by forming a conductive layer on said protection mask and said insulator and then patterning said conductive layer; and a contact region exposing step of removing said protection mask and exposing a contact region of said gate backing pad by performing an etching with use of an etching mask having an opening which exposes an upper surface and a side wall of said protection mask, after said pixel electrode forming step.

24. A manufacturing method according to claim 22, wherein said source-drain electrode forming step includes a step of forming a gate pad on a contact region of said gate backing pad.

25. A method of manufacturing a transistor array, comprising:

a gate electrode forming step of forming a gate electrode and a gate backing pad connected to the gate electrode, on a substrate;

an insulator forming step of forming an insulator on said gate electrode, said gate backing pad and said substrate;

a semiconductor section forming step of forming a semiconductor section having characteristics of a semiconductor, on a portion of said insulator, situated above said gate electrode;

a protection mask forming step of forming a protection mask on said gate backing pad so as to cover a contact region of said gate backing pad via said insulator; and a source-drain electrode forming step of forming a source electrode and a drain electrode to be separated from each other, on the semiconductor section.

26. A manufacturing method according to claim 25, further comprising:

a pixel electrode forming step of forming a pixel electrode on said insulator on said substrate by forming a conductive layer on said protection mask and said insulator and then patterning said conductive layer; and a contact region exposing step of removing said protection mask and exposing a contact region of said gate backing pad by performing an etching with use of an etching mask having an opening which exposes an upper surface and a side wall of said protection mask, after said pixel electrode forming step.

27. A manufacturing method according to claim 25, wherein said source-drain electrode forming step includes a step of forming a gate pad on said contact region of said gate backing pad.

* * * * *